(12) United States Patent
Tamaru

(10) Patent No.: US 11,600,896 B2
(45) Date of Patent: Mar. 7, 2023

(54) ANTENNA CONTROL APPARATUS AND ANTENNA SYSTEM

(71) Applicant: DENSO CORPORATION, Kariya (JP)

(72) Inventor: Tomonaga Tamaru, Kariya (JP)

(73) Assignee: DENSO CORPORATION, Kariya (JP)

( * ) Notice: Subject to any disclaimer, the term of this patent is extended or adjusted under 35 U.S.C. 154(b) by 99 days.

(21) Appl. No.: 17/184,653

(22) Filed: Feb. 25, 2021

(65) Prior Publication Data

US 2021/0280957 A1  Sep. 9, 2021

(30) Foreign Application Priority Data

Mar. 6, 2020  (JP) ................. JP2020-039335

(51) Int. Cl.
*H01Q 1/00* (2006.01)
*G01R 19/165* (2006.01)

(52) U.S. Cl.
CPC ....... *H01Q 1/002* (2013.01); *G01R 19/16576* (2013.01)

(58) Field of Classification Search
CPC . H01Q 1/002; H01Q 3/24; H01Q 1/50; G01R 19/16576; H04B 1/04
USPC ............. 324/114, 500, 523, 600, 713, 76.11, 324/76.39
See application file for complete search history.

(56) References Cited

U.S. PATENT DOCUMENTS

| | | | | |
|---|---|---|---|---|
| 2019/0349025 A1* | 11/2019 | Murakami | ............. | H01Q 21/28 |
| 2021/0159719 A1* | 5/2021 | Yu | ............. | H02J 50/20 |

FOREIGN PATENT DOCUMENTS

| | | |
|---|---|---|
| JP | 2008-022233 A | 1/2008 |
| JP | 5726353 B1 | 5/2015 |
| JP | 2017-103609 A | 6/2017 |

* cited by examiner

*Primary Examiner* — Lee E Rodak
*Assistant Examiner* — Trung Q Nguyen
(74) *Attorney, Agent, or Firm* — Harness, Dickey & Pierce, P.L.C.

(57) ABSTRACT

An antenna system includes an antenna and an antenna control apparatus. The antenna control apparatus includes a control circuit, i.e., a control integrated circuit. The control circuit adjusts and boosts an antenna voltage to supply a required current to the antenna. The antenna voltage is maintained so as not to exceed a predetermined upper limit voltage threshold value. The control circuit is configured to determine a disconnection failure on the antenna when the antenna voltage detected by an overvoltage detection circuit reaches the upper limit voltage threshold value, or is boosted beyond the upper limit voltage threshold value.

6 Claims, 7 Drawing Sheets

ANTENNA CONTROL APPARATUS AND ANTENNA SYSTEM

CROSS REFERENCE TO RELATED APPLICATIONS

The present application is based on and claims the benefit of priority from Japanese Patent Application No. 2020-39335 filed in Japan filed on Mar. 6, 2020, the entire disclosure of the above application is incorporated herein by reference.

TECHNICAL FIELD

This disclosure relates to an antenna control apparatus and an antenna system, which are capable of detecting a disconnection on an antenna.

BACKGROUND

An antenna system includes an antenna and an antenna control apparatus. The antenna control apparatus may be required to detect a disconnection failure on an antenna circuit. In some application of the antenna system, it is required to configure the system with less number of electric components. In the above aspects, or in other aspects not mentioned, there is a need for further improvements in an antenna control apparatus and an antenna system.

SUMMARY

An antenna control apparatus, comprising: an antenna power source which adjusts an antenna voltage applied to an antenna; a voltage detection circuit which detects the antenna voltage; a current detection circuit which detects a current flowing through the antenna; and a control circuit which is configured to: adjust the antenna voltage by the antenna power source to supply a required current for transmitting a radio wave from the antenna, the antenna voltage being maintained not exceed a predetermined upper limit voltage threshold value; and determine a disconnection on the antenna when the antenna voltage detected by the voltage detection circuit is adjusted to exceed the upper limit voltage threshold value while the antenna voltage is adjusted.

According to this antenna control apparatus, the control circuit adjusts the antenna voltage by the antenna power source in order to supply the required current through the antenna, and adjusts the antenna voltage so as not to exceed a predetermined upper limit voltage threshold value. If the antenna is disconnected, the current detected by the current detection circuit is not be detected, the voltage adjustment is continued to boost the antenna voltage, and then the antenna voltage exceed the upper limit voltage threshold value at a time of boosting. Therefore, when the control circuit adjusts the antenna voltage, if the antenna voltage detected by the voltage detection circuit is boosted beyond the upper limit voltage threshold value, it is determined that the antenna is disconnected. In the antenna control apparatus, the disconnection detection of the antenna is possible by utilizing the above mentioned voltage adjustment function without additional dedicated circuit components for disconnection detection.

BRIEF DESCRIPTION OF THE DRAWINGS

The disclosure is further described with reference to the accompanying drawings in which.

DESCRIPTION OF EMBODIMENT

Figure 1:
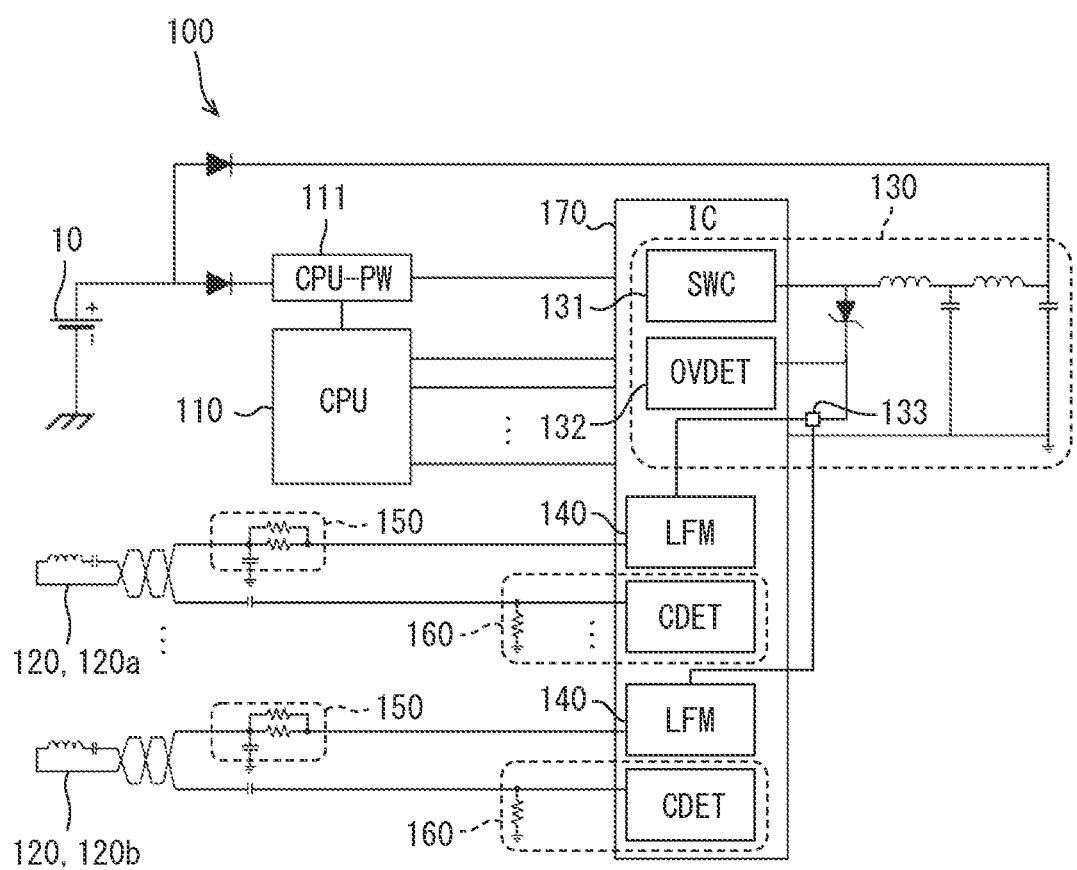
FIG. 1 is a configuration diagram showing an overall configuration of an antenna control apparatus of a first embodiment.

Hereinafter, a plurality of embodiments are described with reference to the drawings. In each of the embodiments, the same reference numerals are assigned to portions corresponding to the items described in the preceding embodiments, and a repetitive description thereof may be omitted. When only a part of the configuration is described in each form, the other forms described above can be applied to the other parts of the configuration. It may be possible not only to combine parts the combination of which is explicitly described in an embodiment, but also to combine parts of respective embodiments the combination of which is not explicitly described if any obstacle does not especially occur in combining the parts of the respective embodiments.

JP2008-22233A discloses an antenna control apparatus and an antenna system. The antenna system, i.e., a wireless communication system, includes an antenna for transmitting and receiving radio waves. The antenna system also includes a control unit for controlling, i.e., driving the antenna. The system has an H-bridge circuit including four transistors for controlling the antenna. Among the four transistors, one transistor provides a current detection transistor which is a part of a current mirror circuit for detecting a current flowing. Further, a current detection resistor is provided for the current detection transistor.

The control unit is configured to determine an open failure, i.e., disconnection, on the antenna when a voltage generated on the current detection resistor is less than a threshold voltage. This is because if a proper antenna current is supplied, the voltage generated on the current detection resistor may excess the threshold voltage.

However, JP2008-22233A requires the H-bridge circuit including the current detection transistor and the current detection resistor configuring the current mirror circuit. This arrangement requires several circuit components and cost.

It is an object of this disclosure to provide an antenna control apparatus and an antenna system which is capable of detecting disconnection of an antenna with small number of circuit components.

First Embodiment

An antenna system 100 of this embodiment is described with reference to FIG. 1 to FIG. 6. The antenna system 100 provides a wireless communication system which includes an antenna and an antenna control apparatus configured connectable with the antenna. The antenna control apparatus is a circuit including a radio transmitter circuit for transmitting radio waves via the antenna and a radio receiver circuit for receiving radio waves via the antenna. The antenna system 100 may be on a base station or a mobile station. For example, the antenna system 100 may be a base station on a vehicle 1. The base station is configured to perform data communication with a mobile station carried by a vehicle user, and perform functions for a smart entry system which enables at least a remote lock or unlock function. The antenna system 100 at least provides the radio transmitter. The smart entry system does not require a lock or unlock manual operation by inserting an actual key into a door cylinder of the vehicle 1. The smart entry system is a system that enables at least a lock or unlock operation of the vehicle by a wireless communication and a predetermined simple operation. The predetermined simple operation includes, for example, a touch operation on a switch provided on a doorknob for locking the door, a grabbing operation on the doorknob for unlocking the door, and the like.

The antenna control apparatus has a current adjusting function which adjusts an intensity of a transmitted radio wave by supplying a required antenna current to flow through the antenna 120 by adjusting an antenna voltage applied to an antenna 120. The antenna control apparatus has a protective function which protects a circuit associated with the antenna 120 by suppressing the antenna voltage so as not to become excessive voltage by the voltage adjustment, i.e., a boost function, for the current adjusting function. In other words, the antenna control apparatus protects the antenna 120 and the circuit by controlling the antenna voltage so as not to exceed a predetermined upper limit voltage threshold value. The antenna control apparatus has both the current adjusting function and a protective function. The antenna control apparatus also functions as a device for detecting a disconnection, i.e., an open state of the antenna 120 by utilizing those functions. Details are described later.

The antenna system 100 includes at least one antenna 120 and circuit components for the antenna control apparatus. The antenna control apparatus includes a central processing unit 110 (CPU), an antenna power source 130, at least one LF modulation transmitter 140 (LFM), at least one damping resistor 150, at least one current detection circuit 160 (CDET), a control integrated circuit 170 (IC), and the like. The antenna system 100 includes a plurality of antennas 120. The antenna control apparatus includes a plurality of sets of the LF modulation transmitter 140, the damping resistor 150, and the current detection circuit 160. A number of sets corresponds to a number of antennas.

The CPU 110 is operated by electric power from the CPU power source 111 (CPU-PW). The CPU 110 is configured as, for example, a part that performs comprehensive control in the smart entry system. A vehicle battery 10 supplies power to the CPU power source 111. The CPU power source 111 is configured to supply power of a predetermined voltage to the CPU 110 and the control IC 170. The CPU 110 is connected to the control IC 170 to perform data communication. The CPU 110 outputs instructions to the control IC 170, and causes the antenna 120 to transmit a call signal to the portable device carried by the user. The portable device returns a response signal including an authentication data in response to the call signal. The CPU 110 receives the response signal by a receiver circuit, and performs data authentication whether or not the portable device is a proper device. After the authentication, the CPU 110 locks or unlocks a lock mechanism of the vehicle door when the user performs a predetermined operation.

The CPU 110 includes at least one processor which can execute a program for providing the above-mentioned functions. The processor may include a processor circuit which is configured to perform the program. The processor circuit may be referred to as a logic circuit, an accelerator, a Gate Array, a Field Programmable Gate Array, or the like. The processor circuit may have circuit configurations corresponding to the program. The processor may include a micro-processor and a memory such as a semiconductor memory. The micro-processor is configured to execute the program which is computer readable instructions stored in the memory. The memory is a non-transitional tangible recording medium and stores the computer readable instructions executed by the micro-processor.

Figure 2:
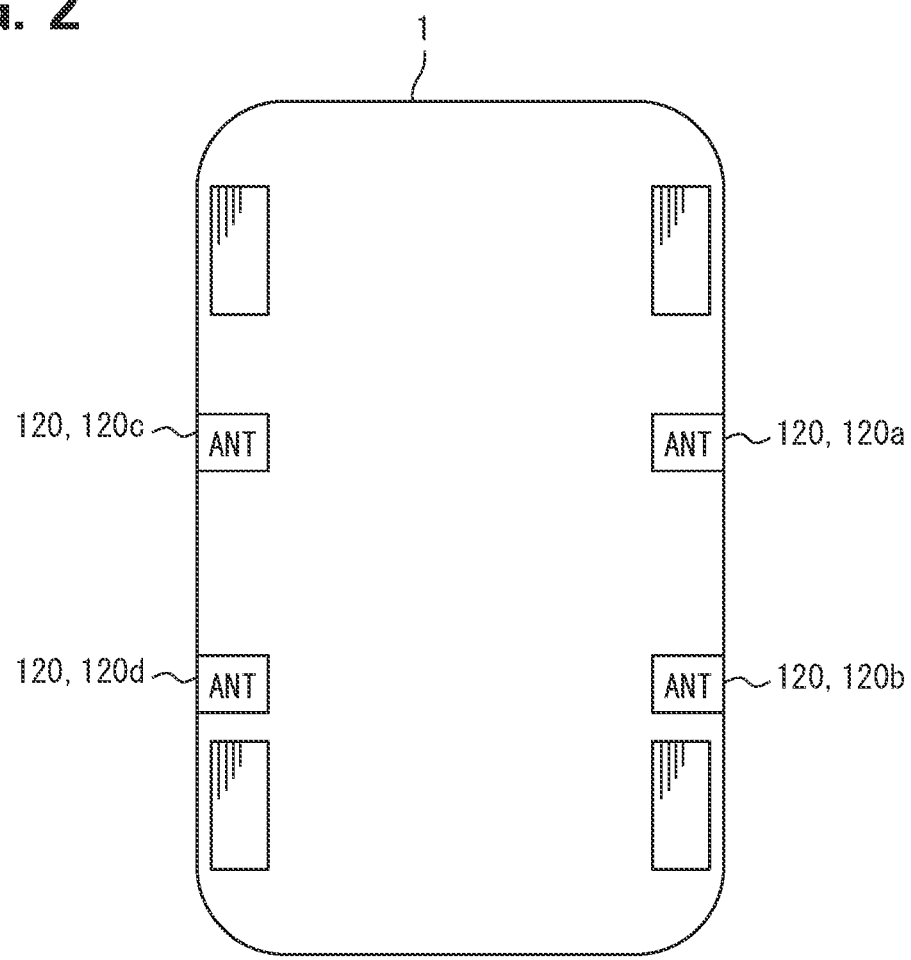
FIG. 2 is an explanatory diagram showing a plurality of antennas provided in a vehicle.

The antenna 120 includes a plurality of antennas mounted on throughout the vehicle 1 in a distributive manner. The antenna 120 is at least used as an element for transmitting a radio wave, i.e., a transmission antenna for transmitting a call signal. Here, as shown in FIG. 2, four antennas 120*a*, 120*b*, 120*c*, and 120*d* are arranged to doorknobs on a front right door, a front left door, a rear right door, and a rear left door, respectively. Hereinafter, the word "the antenna 120" may be used to indicate each one of the antennas 120*a*, 120*b*, 120*c*, and 120*d* or a group of the plurality of antennas collectively. In specific occasions, each one of the antennas 120*a*, 120*b*, 120*c*, and 120*d* may be referred to with lowercase alphabetic identifiers, such as the antenna 120*a* or the antenna 120*b*. For example, FIG. 2 only illustrates representative antennas 120*a* and 120*b*. The antenna 120 is formed of a coil, a capacitor, and the like. The antenna 120 is, for example, an LF antenna that transmits an LF wave, i.e., a Low Frequency wave as the call signal. The LF antenna transmits a long wavelength radio wave.

The antenna 120 is provided with two connecting lines. An end of one of the connecting lines is connected to the LF modulation transmitter 140. Further, an end of the other connecting line is connected to the current detection circuit 160. Each one of the antennas 120*a*, 120*b*, 120*c*, and 120*d* has the same structures.

The antenna power source 130 is a circuit component for adjusting the antenna voltage applied to the antenna 120. The antenna power source 130 includes several electric component such as a coil, a capacitor, a diode, or the like. The vehicle battery 10 supplies power to the antenna power source 130. The antenna power source 130 includes a switching circuit 131 (SWC), an overvoltage detection circuit 132 (VDET), an antenna selector switch 133, and the like. The switching circuit 131, the overvoltage detection circuit 132, and the antenna selector switch 133 are provided in the control IC 170.

The antenna power source 130 is, for example, a converter circuit that adjusts the antenna voltage in order to supply a required current to the antenna 120. The converter circuit may be referred to as a voltage booster circuit which increases the antenna voltage. The required current is determined based on a transmission power in order to transmit the LF wave via the antenna 120. By changing the antenna voltage, i.e., boosting the antenna voltage, it is possible to change, i.e., to increase the intensity of the transmitted radio wave from the antenna 120.

The switching circuit 131 at least includes a switch, i.e., an on/off switch, which performs voltage adjustment, i.e., the boost function. The overvoltage detection circuit 132 is a circuit which detects the antenna voltage at a time of voltage adjustment, i.e., during performing the boost function. In addition, the overvoltage detection circuit 132 detects an overvoltage exceeding a predetermined upper limit voltage threshold value in order to protect the antenna power source 130 including the control IC 170 in the voltage detection. The overvoltage detection circuit 132 corresponds to the voltage detection circuit. The antenna selector switch 133 is a switch for sequentially switching operative one of antennas among the plurality of antennas 120a, 120b, 120c, and 120d in a time division manner. The antenna power source 130 is connected to the LF modulation transmitters 140 of each one of the antennas 120a, 120b, 120c, and 120d.

The LF modulation transmitter 140 is a circuit which modulates a carrier wave to send a signal and transmits a modulated signal from the antenna 120. The modulation is performed by changing at least one of an amplitude, a frequency, and/or a phase of a carrier wave in accordance with a signal to be transmitted. The LF modulation transmitter 140 is provided in the control IC 170.

The damping resistor 150 is provided on an intermediate portion of one of the connecting lines of the antenna 120. The damping resistor 150 suppresses an excessive flow of the current in the antenna 120 and stabilizes the current.

The current detection circuit 160 is a circuit which detects the current flowing through the antenna 120. The current detection circuit 160 is provided in the control IC 170.

The control IC 170 is operated by electric power of the CPU power source 111. The control IC 170 is a circuit which controls radio wave transmission from the antenna 120 by supplying the required current to the antenna 120 by adjusting the antenna voltage supplied from the antenna power source 130. The control IC 170 also adjusts the antenna voltage supplied from the antenna power source 130 so as not to exceed the upper limit voltage threshold value. The control IC 170 corresponds to the control circuit.

The antenna control apparatus of this embodiment is configured as described above. The antenna control apparatus performs operations and effects described below with reference to FIG. 3 to FIG. 6.

Figure 3:
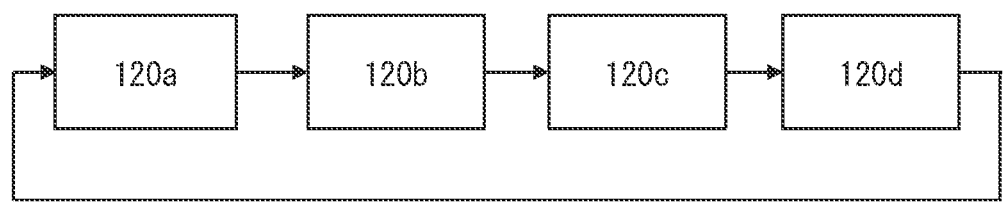
FIG. 3 is an explanatory diagram showing an orderly disconnection determination method of a plurality of antennas.

The antenna control apparatus sequentially assign each one of the antennas 120a, 120b, 120c, and 120d by the antenna selector switch 133 in a predetermined order as an operative antenna. The one assigned antenna is at least operated to transmit radio waves. The antenna control apparatus sets and adjust an antenna voltage by a boosting voltage function or a reducing voltage function of the antenna power source 130. The antenna control apparatus applies the antenna voltage to each one of the antennas 120a, 120b, 120c, and 120d. The antenna control apparatus transmits radio waves from each one of the antennas 120a, 120b, 120c, and 120d by applying the antenna voltage. At this time, the control IC 170 sequentially determines a presence or absence of disconnection of each antennas 120a, 120b, 120c, and 120d in accordance with a sequential switching control of the antennas 120a, 120b, 120c, and 120d, as shown in FIG. 3. For example, the disconnection determination is cyclically executed in the order of the antennas 120a, 120b, 120c, and 120d. In the following description, the representative antennas 120a and 120b are used to describe a sequential selection among a plurality of antennas.

Figure 4:
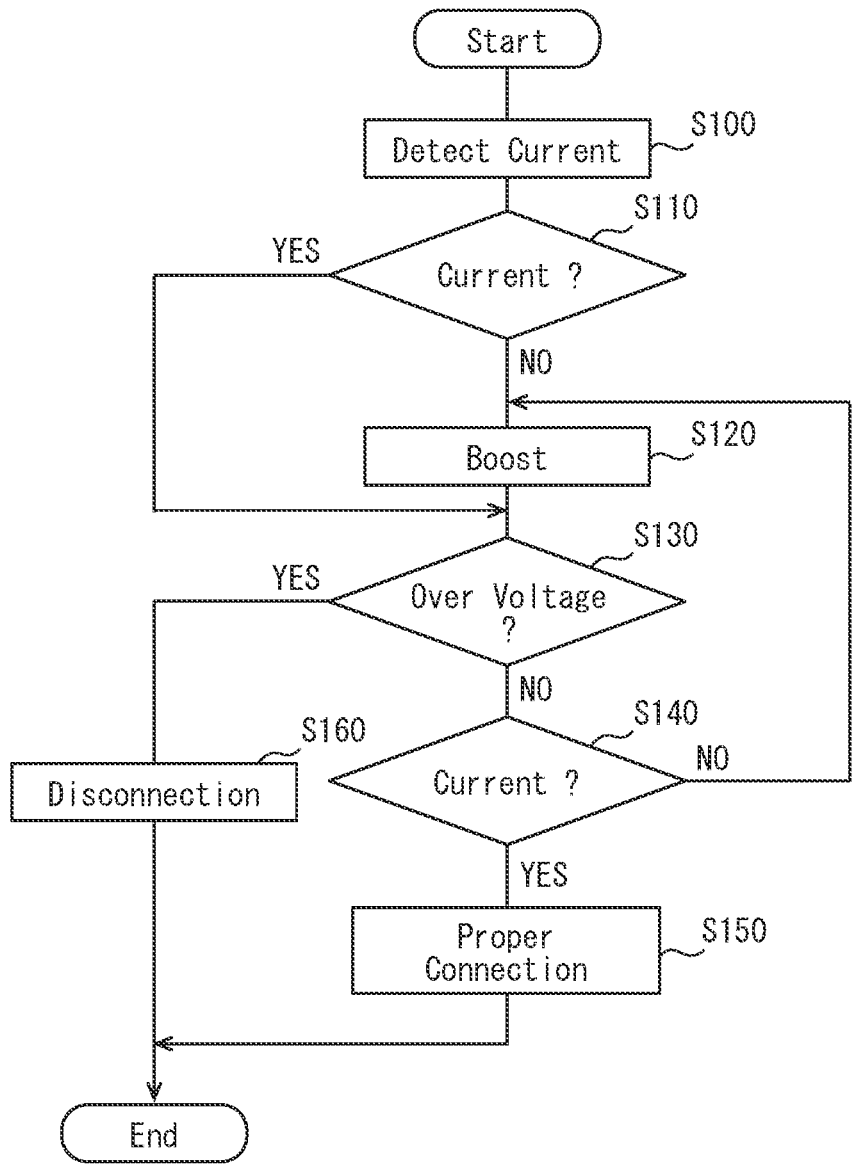
FIG. 4 is a flowchart showing a control procedure of a disconnection determination method performed by a control integrated circuit.

As shown in FIG. 4, the control IC 170 first acquires the current supplied to the antenna 120a from the current detection circuit 160 in step S100 for the antenna 120a. Step S100 is also a process of detecting the current of the antenna 120a.

Next, in step S110, the control IC 170 determines whether or not the current acquired in step S100 is a regular current value. For example, the regular current value is predetermined as a specific lower limit of regular current range. Step S110 is also a process of evaluating the current.

If it is determined in step S110 that the current is insufficient, the control IC 170 controls the antenna power source 130 to perform the boost function in step S120. For example, in a case that a combined impedance of the antenna 120a and the damping resistor 150 is 20.0Ω (Ohms), the required current is 1.0 A (Amperes), and the input from the vehicle battery 10 is 12V (Volts), the antenna voltage is insufficient to supply the required current. Therefore, the control IC 170 controls the antenna power source 130 to boost the antenna voltage up to 20V (Volts) so that the 1.0 A (Amperes) current is supplied and flow. Step S120 is also a process of boosting the antenna voltage.

If it is determined in step S110 that the current is not insufficient, step S120 is passed through and the process proceeds to step S130. A state in which the current is not insufficient includes a state in which the current is equal to the regular current value.

Next, after step S120, in step S130, the control IC 170 determines whether or not an overvoltage has been detected. That is, the control IC 170 controls the antenna power source 130 to boost the antenna voltage. The control IC 170 determines whether or not the antenna voltage detected by the overvoltage detection circuit 132 exceeds the upper limit voltage threshold value while boosting the antenna voltage. The determination of whether or not the detected voltage exceeds the upper limit voltage threshold value is also the determination of whether or not the detected voltage has entered the overvoltage region. The upper limit voltage threshold value is a determination value provided to protect circuit components in the antenna power source 130 and the control IC 170 so that the antenna voltage generated by boosting does not become excessive level. That is, the antenna voltage applied to the antenna 120a is controlled so as not to exceed the upper limit voltage threshold value even if the antenna voltage is boosted. The protective function is provided in the overvoltage detection circuit 132. The upper limit voltage threshold value included within the overvoltage region may be referred to as an overvoltage threshold value. Step S130 is also a process of determining whether or not the antenna voltage is overvoltage.

Figure 5:
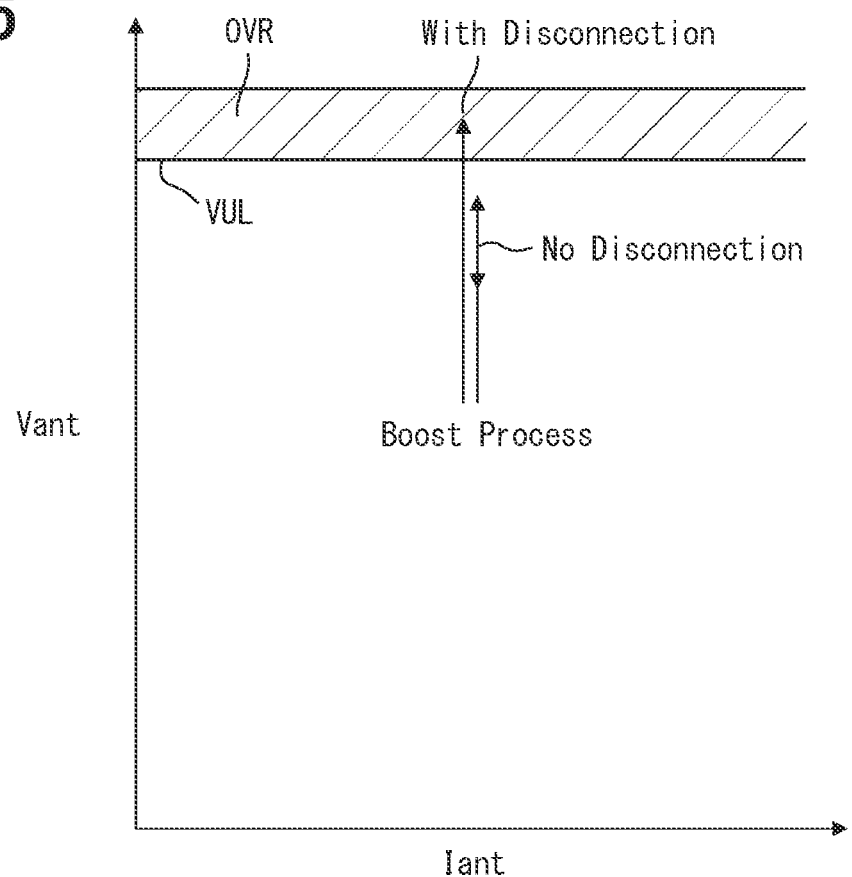
FIG. 5 is an explanatory diagram showing an upper limit voltage threshold value for determining disconnection.

FIG. 5 shows a relationship between a boost process (Boost Process), the overvoltage region (OVR), and the upper limit voltage threshold value (VUL). The vertical axis shows the antenna voltage Vant of the power source. The horizontal axis shows the antenna current Iant. The drawing illustrates a process of boosting the antenna voltage, a case where there is a disconnection (With Disconnection), and a case where there is no disconnection (No Disconnection) at a predetermined antenna current Iant.

If a negative determination is made in step S130, no overvoltage is detected, and the process further proceeds to step S140. In step S140, the control IC 170 determines whether or not the current in the current detection circuit 160 is the regular current value. If the control IC 170 determines a negative determination, the process returns to step S120 and repeats steps S120 to S140. In this case the boost function continues. Further, if an affirmative determination is made in step S140, the control IC 170 determines that the connection state of the antenna 120 is normal, i.e., the antenna 120 is connected, in step S150. Step S150 is also a process of determining a normal connection.

However, if an affirmative determination is made in step S130, the control IC 170 determines that the antenna 120a is abnormal, i.e., the antenna 120a is disconnected. In step S130 is the overvoltage is detected, the affirmative determination is made. That is, if the antenna 120*a* is disconnected, no current flows even if the voltage is boosted, so that the current signal is not detected in the current detection circuit 160. Therefore, the control IC 170 determines that the voltage is insufficient, further boosts the voltage, and a state in which the antenna voltage exceeds the upper limit voltage threshold value occurs.

In this case, in step S160, the control IC 170 determines that the antenna 120 is disconnected, and ends the process of this control. Step S160 is also a process for determining disconnection.

Figure 6:
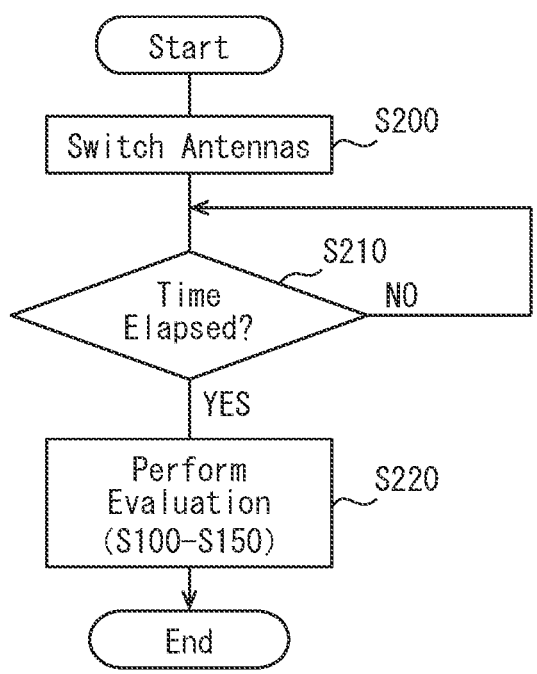
FIG. 6 is a flowchart showing a control procedure for determining disconnection from one antenna to another.

Next, in order to check whether the antenna 120*b* is disconnected or not, in step S200, the control IC 170 switches the operative one from the antenna 120*a* to the antenna 120*b* by the antenna selector switch 133, as shown in FIG. 6. Step S200 is also a process of switching the antennas 120*a*, 120*b*, 120*c*, and 120*d*. Next, the control IC 170 waits for a predetermined fixed time to elapse in step S210. By leaving the circuit for a predetermined time period, the antenna power source 130 is discharged, and the boost voltage at the antenna 120*a* is reduced. Step S210 is also a process of determining elapse of the predetermined time period.

Then, in step S220, by executing the process, i.e., steps S100 to S160 described in FIG. 4, it is determined whether or not the next antenna 120*b* is disconnected. Step S220 is also a next process of evaluating a next antenna, e.g., the antenna 120*b* after elapsed the predetermined time period after completing a previous process of evaluating a previous antenna, e.g., the antenna 120*s*.

In the description, the antenna 120*a* corresponds to one previous antenna, and the antenna 120*b* corresponds to another next antenna.

As described above, in the present embodiment, the control IC 170 adjusts the antenna voltage by the antenna power source 130 in order to supply the required current through the antenna 120. Further, the control IC 170 has a function of adjusting the antenna voltage while adjusting the antenna voltage so as not to exceed a predetermined upper limit voltage threshold value. If the antenna 120 is disconnected, the current in the current detection circuit 160 is not detected, the current is determined to be insufficient in step S110, and the boosting is continued, and the voltage exceeds the upper limit voltage threshold value. Therefore, the control IC 170 is configured to determine a disconnection on a circuit connected to the antenna or the antenna when the antenna voltage detected by the voltage detection circuit 132 reaches the upper limit voltage threshold value while the antenna voltage is adjusted. In other words, the control IC 170 can determine that the antenna 120 has a disconnection failure when the voltage detected by the overvoltage detection circuit 132 is boosted beyond the upper limit voltage threshold value when the voltage adjustment is performed. In the antenna control apparatus, the disconnection detection of each one of the antennas 120*a*-120*d* is possible by utilizing the above mentioned voltage adjustment function without additional dedicated circuit components for disconnection detection.

As described above, the control circuit, the control IC 170, is configured to adjust the antenna voltage by the antenna power source to supply a required current for transmitting a radio wave from the antenna. The control circuit, the control IC 170, is configured to maintain the antenna voltage not exceed a predetermined upper limit voltage threshold value. Therefore, the antenna voltage is variable equal to or less than the predetermined upper limit voltage threshold value. The control circuit, the control IC 170, is configured to determine a disconnection on the antenna when the antenna voltage detected by the voltage detection circuit reaches the upper limit voltage threshold value while the antenna voltage is adjusted. In other words, the control circuit is configured to determine a disconnection on the antenna when the antenna voltage detected by the voltage detection circuit is adjusted to exceed the upper limit voltage threshold value while the antenna voltage is adjusted.

Further, an overvoltage detection circuit 132 in which an upper limit voltage threshold value is set is used as the voltage detection circuit. Therefore, it is possible to detect the disconnection of the antenna 120 as well as detect the overvoltage.

Further, the antenna 120 is the LF antenna that transmits a low frequency radio wave used for the smart entry system. The antenna 120 includes a plurality of antennas 120*a*, 120*b*, 120*c*, and 120*d* subject to a disconnection determination.

Further, the antenna control apparatus is configured to wait a predetermined time period between a determining disconnection of one antenna, e.g., the antenna 120*a*, and a determining disconnection of the other one antenna, e.g., the antenna 120*b*. As a result, a boosted state for one of the antennas, e.g., the antenna 120*a*, is cancelled and the boosted voltage is discharged during the predetermined time period. Then the process transits to a next disconnection determination for the next one of the antennas, e.g., the antenna 120*b*, and the next disconnection determination is performed after the predetermined time period. Therefore, it is possible to prevent a miss determination that the antenna is disconnected even though the antenna is not actually disconnected.

Second Embodiment

Figure 7:
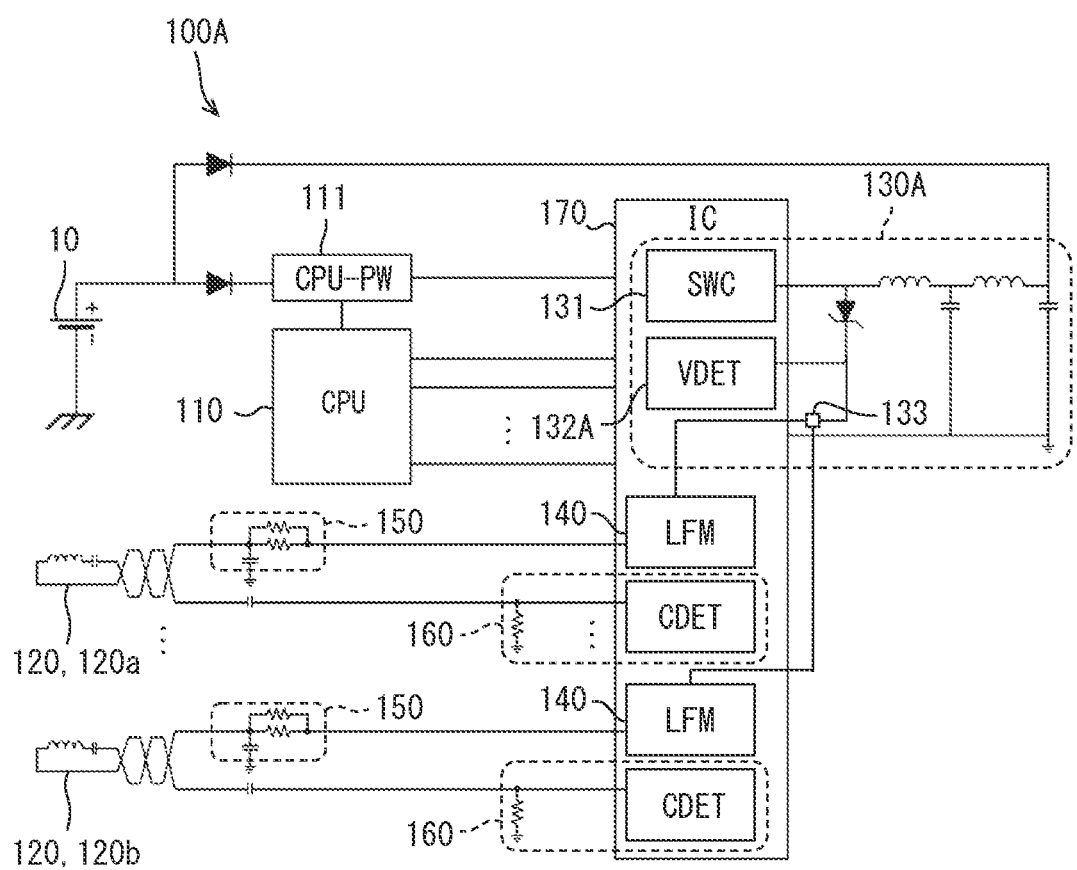
FIG. 7 is a configuration diagram showing an overall configuration of an antenna control apparatus of a second embodiment.
Figure 8:
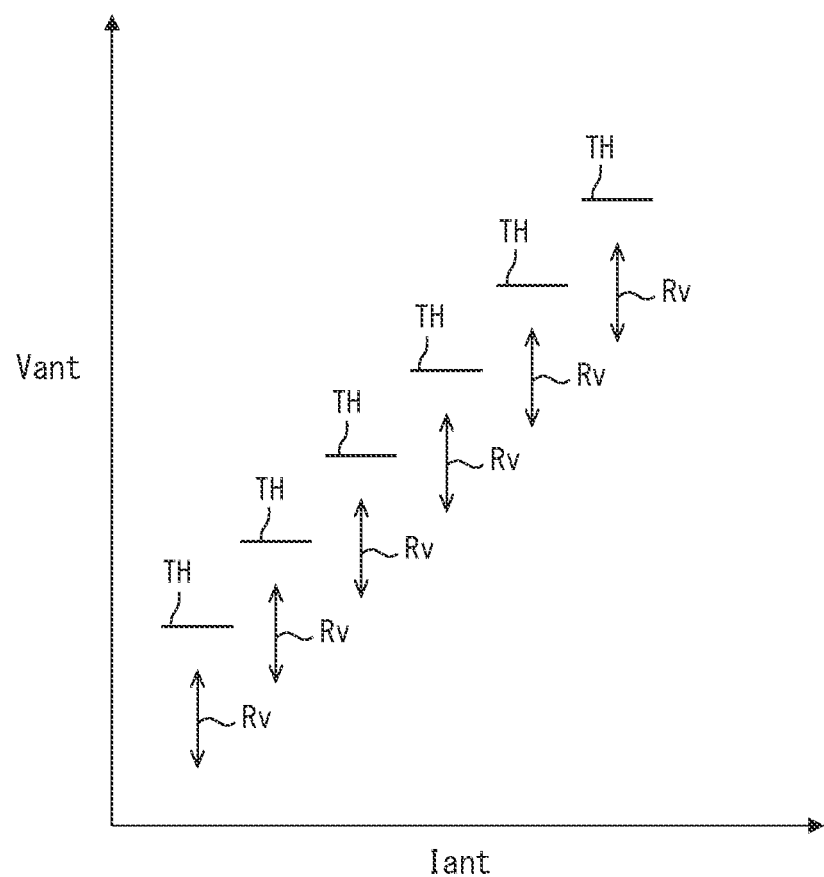
FIG. 8 is an explanatory diagram showing a threshold value for determining disconnection.
Figure 9:
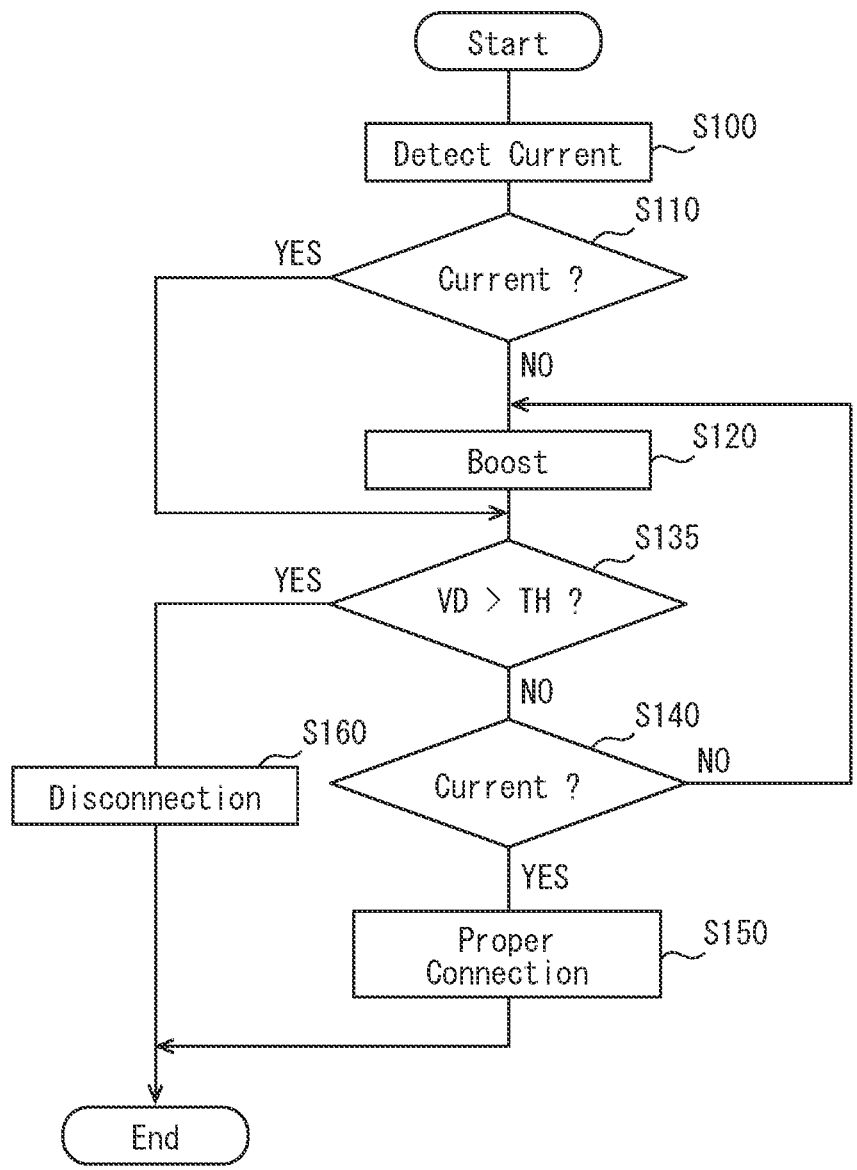
FIG. 9 is a flowchart showing a control procedure of a disconnection determination method performed by a control integrated circuit.

FIG. 7 to FIG. 9 show this embodiment. The antenna system 100A of this embodiment is a modification of the antenna system 100 of the preceding embodiment. In this embodiment, as shown in FIG. 7, the overvoltage detection circuit 132 is changed to the voltage detection circuit 132A. The voltage detection circuit 132A provides a modified example of the control procedure for determining the disconnection of the antenna 120.

The voltage detection circuit 132A detects the antenna voltage during a time period in which a regular voltage adjustment is performed below the upper limit voltage threshold value. The voltage detection circuit 132A may be provided with a function of detecting an overvoltage. The voltage detection circuit 132A is a circuit provided for detecting whether an appropriate voltage corresponding to each electronic component is applied to various electronic components provided in the control IC 170.

As shown in FIG. 8, the control IC 170 is set with a working voltage range Rv to be adjusted according to the required current flowing through the antenna 120. As described above, the required current indicates the transmission power to be transmitted by the antenna 120. A certain range of transmission power is defined by standards and the like. Therefore, the required current also has a range of use. Since the required current has a working range, the voltage for supplying the required current also has a working range, that is, a working voltage range Rv. The reason why a plurality of working voltage ranges Rv are shown in FIG. 8 is that the transmitting power of the antenna 120 differs depending on the type, application, and the like. Different transmission powers require different currents to supply the antenna. FIG. 8 shows a relationship described above. In FIG. 8, the required current to be supplied to the antenna 120 is described as the antenna current Iant. The vertical axis shows the antenna voltage Vant of the antenna power source. The upper limit voltage threshold value TH in this embodiment is a value obtained by adding a predetermined value to the upper limit value of each operating voltage range Rv. The predetermined value is a value for surely determining that the upper limit value of the working voltage range Rv has been exceeded even if the voltage detection error and the like are taken into consideration.

The control IC 170 determines the disconnection of the antenna 120 based on the flowchart shown in FIG. 9. The flowchart of FIG. 9 is obtained by changing step S130 to step S135 with respect to the flowchart of FIG. 4 described in the preceding embodiment.

The control IC 170 executes step S135 after steps S100 to S120. In step S135, the control IC 170 determines whether or not the voltage VD due to the boosting exceeds the upper limit voltage threshold value TH (FIG. 8). This determination determines an affirmative determination when VD>TH is satisfied. Step S135 is also a process of determining whether or not the antenna voltage VD of the antenna subject to an evaluation exceeds the predetermined voltage TH. If the control IC 170 determines an affirmative determination in step S135, the control IC 170 determines that the antenna 120 is abnormal, i.e., the antenna 120 is disconnected, in step S160. Although a plurality of upper limit voltage threshold values TH are shown in FIG. 8, which upper limit voltage threshold value TH is used in this step S135 is determined before the processing of FIG. 9 is executed, such as during product manufacturing. If a negative determination is made in step S135, the control IC 170 determines in step S140 whether or not the current in the current detection circuit 160 is the regular current value. If the control IC 170 determines an affirmative determination, the control IC 170 determines that the connection state of the antenna 120 is normal in step S150. If the control IC 170 determines a negative determination, the process repeats steps S120 to S140. In this case the boost function continues.

In this embodiment, instead of the upper limit voltage threshold value in the preceding embodiment, the upper limit voltage threshold value TH, which is defined by adding a predetermined value to the working voltage range Rv corresponding to the required current, is provided. In this embodiment, the presence or absence of disconnection of the antenna 120 is determined based on the upper limit voltage threshold value TH. Therefore, unlike the preceding embodiment, it is possible to determine the disconnection of the antenna 120 in a short time without requiring the time for boosting to the overvoltage state.

Other Embodiments

The disclosure in this specification and drawings etc. is not limited to the exemplified embodiment. The disclosure encompasses the illustrated embodiments and variations thereof by those skilled in the art. For example, the present disclosure is not limited to the combinations of components and/or elements shown in the embodiments. The present disclosure may be implemented in various combinations. The present disclosure may have additional portions which may be added to the embodiments. The disclosure encompasses omission of components and/or elements of the embodiments. The disclosure encompasses the replacement or combination of components and/or elements between one embodiment and another. The disclosed technical scope is not limited to the description of the embodiment. It should be understood that some disclosed technical ranges are indicated by description of claims, and includes every modification within the equivalent meaning and the scope of description of claims.

The control circuit includes at least one processor which can execute a program for providing the above-mentioned functions. The processor may include a processor circuit which is configured to perform the program. The processor circuit may be referred to as a logic circuit, an accelerator, a Gate Array, a Field Programmable Gate Array, or the like. The processor circuit may have a fixed or variable circuit configurations corresponding to the program. Alternatively, the processor may include a micro-processor and a memory such as a semiconductor memory. The micro-processor is configured to execute the program which is computer readable instructions stored in the memory. The memory is a non-transitional tangible recording medium and stores the computer readable instructions executed by the micro-processor.

The control circuit, i.e., the control IC 170, and the method performed therein may be provided by a dedicated computer. The dedicated computer may include at least one processor which executes computer readable programs and at least one memory which stores the computer readable programs.

Alternatively, the control circuit or the method disclosed may be provided by a dedicated computer which includes at least one processor configured by at least one dedicated hardware logic circuits.

Alternatively, the control circuit or the method disclosed may be provided by a dedicated computer which includes a combination of at least one processor which executes computer readable programs and at least one memory which stores the computer readable programs, and at least one processor configured by at least one dedicated hardware logic circuits.

The computer readable program may be stored, as instructions to be executed by a computer, in the memory which is a tangible non-transitory computer-readable medium. The memory may be provided by a semiconductor memory device or a programmable circuit.

Here, the flowcharts described in the present embodiment or the processing of the flowchart are composed of a plurality of sections, and each section is expressed as, for example, step S110. Further, each section can be divided into multiple subsections, while multiple sections can be combined into one section. Furthermore, each section thus configured may be referred to as a device, module, or means.

In each of the above embodiments, the antenna 120 has been described as the LF antenna, but the present invention is not limited to this, and can be widely applied to other types of antennas such as RF antennas, i.e., Radio Frequency antennas.

Further, in each of the above embodiments, a plurality of antennas 120 are arranged, but a single antenna 120 may be arranged.

Further, in each of the preceding embodiments, the antenna systems 100 and 100A have been described as being used in the smart entry system for the vehicle 1. But the antenna systems 100 and 100A can be widely applied as a transmission device for transmitting radio waves to a predetermined device.

What is claimed is:

1. An antenna control apparatus, comprising:
an antenna power source which adjusts an antenna voltage applied to an antenna;

a voltage detection circuit which detects the antenna voltage;

a current detection circuit which detects a current flowing through the antenna;

a modulation transmitter which modulates a carrier wave to send a signal and transmits a modulated signal from the antenna; and a control circuit which is configured to:

adjust the antenna voltage by the antenna power source to supply a required current for transmitting the modulated signal from the antenna, the antenna voltage being adjusted by repeating a process of determining whether or not a current detected in the current detection circuit is a regular current value, and a process of boosting the antenna voltage if the current detected in the current detection circuit is insufficient to the regular current value, the antenna voltage detected by the voltage detection circuit being maintained not to exceed a predetermined upper limit voltage threshold value; and determine a disconnection on the antenna when the antenna voltage detected by the voltage detection circuit is adjusted to exceed the upper limit voltage threshold value while the antenna voltage is adjusted, the disconnection on the antenna being determined by utilizing an antenna voltage adjustment function for transmitting the modulated signal from the antenna without additional dedicated circuit components for disconnection detection.

2. The antenna control apparatus claimed in claim 1, wherein
the voltage detection circuit is an overvoltage detection circuit which detects an overvoltage threshold value for protective purpose, and wherein the upper limit voltage threshold value is the overvoltage threshold value.

3. The antenna control apparatus claimed in claim 1, wherein
the upper limit voltage threshold value is set as a value obtained by adding a predetermined value to an upper limit value of a regular work voltage range which is defined between the upper limit value and a lower limit value.

4. The antenna control apparatus claimed in claim 1, wherein
the control circuit controls the antenna as an LF antenna which transmits a low frequency radio wave.

5. The antenna control apparatus claimed in claim 1, wherein
the control circuit is configured to be connected with a plurality of antennas, and wherein
the control circuit is configured to:
determine disconnections of each one of the plurality of antennas one by one in an orderly manner; and
wait a predetermined time period between a determining disconnection of one antenna and a determining disconnection of the other one antenna.

6. An antenna system, comprising:
an antenna; and
the antenna control apparatus claimed in claim 1.

* * * * *